(12) United States Patent  (10) Patent No.: US 7,733,647 B2
Lee  (45) Date of Patent: Jun. 8, 2010

(54) WATERPROOF CASING FOR A POWER SUPPLY

(75) Inventor: Po-Sheng Lee, Sanchung (TW)

(73) Assignee: Hipro Electronics Co., Ltd., Sanchung, Taipei Hsien (TW)

( * ) Notice: Subject to any disclaimer, the term of this patent is extended or adjusted under 35 U.S.C. 154(b) by 254 days.

(21) Appl. No.: 12/047,009

(22) Filed: Mar. 12, 2008

(65) Prior Publication Data

US 2009/0194455 A1  Aug. 6, 2009

(30) Foreign Application Priority Data

Jan. 31, 2008  (TW) .............................. 97202060 U

(51) Int. Cl.
*H05K 7/20* (2006.01)
(52) U.S. Cl. ..................... 361/690; 361/694; 361/695; 361/715
(58) Field of Classification Search ..................... None
See application file for complete search history.

(56) References Cited

U.S. PATENT DOCUMENTS

| | | | | |
|---|---|---|---|---|
| 4,525,769 A * | 6/1985 | Lehmann | ..................... | 361/704 |
| 4,791,719 A * | 12/1988 | Kobayashi et al. | ........ | 29/603.14 |
| 5,065,278 A * | 11/1991 | Schultz | ....................... | 361/688 |
| 6,046,908 A * | 4/2000 | Feng | ........................... | 361/707 |
| 6,081,425 A * | 6/2000 | Cheng | ......................... | 361/704 |
| 7,289,320 B2 * | 10/2007 | Chang et al. | ................ | 361/690 |
| 7,436,661 B2 * | 10/2008 | Fong et al. | ................... | 361/695 |
| 2006/0198104 A1 * | 9/2006 | Chang et al. | ................ | 361/695 |
| 2006/0207786 A1 * | 9/2006 | Clark | ..................... | 174/110 R |
| 2007/0247817 A1 * | 10/2007 | Huang | ........................ | 361/719 |
| 2008/0101041 A1 * | 5/2008 | Chang et al. | ................ | 361/728 |
| 2008/0212292 A1 * | 9/2008 | Yu et al. | ..................... | 361/748 |
| 2008/0291609 A1 * | 11/2008 | Victor et al. | ................ | 361/679 |

\* cited by examiner

*Primary Examiner*—Gregory D Thompson
(74) *Attorney, Agent, or Firm*—patenttm.us

(57) ABSTRACT

A waterproof casing for a power supply has a lower casing, an upper casing, an inlet cover and an outlet cover. The lower cover contains electronic components. The upper casing is mounted on the opening of the lower casing and has an inlet cavity, at least one inlet, an outlet cavity and at least one outlet. The at least one inlet and outlet are formed through the upper casing and respectively communicate with the inlet cavity and outlet cavity. The inlet cover and outlet cover respectively seal the inlet cavity and the outlet cavity, communicate the inlet cavity and the outlet cavity with the lower casing to allow the air to flow inside the casing and to keep the water from flowing in the inlet cavity and the outlet cavity. Structure of the waterproof casing is simplified, so benefits manufacturing.

8 Claims, 7 Drawing Sheets

WATERPROOF CASING FOR A POWER SUPPLY

BACKGROUND OF THE INVENTION

1. Field of Invention

The present invention relates to a casing for a power supply, and more particularly to a waterproof casing for a power supply, which has simplified structures.

2. Description of the Related Art

A power supply usually has a waterproof casing to keep the electronic components inside the power supply from being damaged by water.

As the technology progresses faster and faster, the electronic components inside the power supply are often required to generate more and more power. Thus, more and more heat is generated inside the power supply. Usually, the heat-dissipating devices such as fans are mounted on the casing to dissipate heat out of the power supply.

Therefore, to have the waterproof heat-dissipating devices has become a key point for the power supply. However, the conventional waterproof dissipating devices for the power supply are complicated. The complicated structure costs a lot of money and manufacturing time. Therefore, the conventional waterproof dissipating devices for the power supply is money and time consuming.

To overcome the shortcomings, the present invention provides a waterproof casing for a power supply to mitigate or obviate the aforementioned problems.

SUMMARY OF THE INVENTION

The primary objective of the present invention is to provide a waterproof casing for a power supply, which has simplified structures.

The waterproof casing for a power supply has a lower casing, an upper casing, an inlet cover and an outlet cover. The lower cover contains electronic components. The upper casing is mounted on the opening of the lower casing and has an inlet cavity, at least one inlet, an outlet cavity and at least one outlet. The at least one inlet and outlet are formed through the upper casing and respectively communicate with the inlet cavity and outlet cavity. The inlet cover and outlet cover respectively seal the inlet cavity and the outlet cavity, communicate the inlet cavity and the outlet cavity with the lower casing to allow the air to flow inside the casing and to keep the water from flowing in the inlet cavity and the outlet cavity. Structures of the waterproof casing are simplified, so benefit manufacturing.

Other objectives, advantages and novel features of the invention will become more apparent from the following detailed description when taken in conjunction with the accompanying drawings.

DETAILED DESCRIPTION OF THE INVENTION

Figure 1:
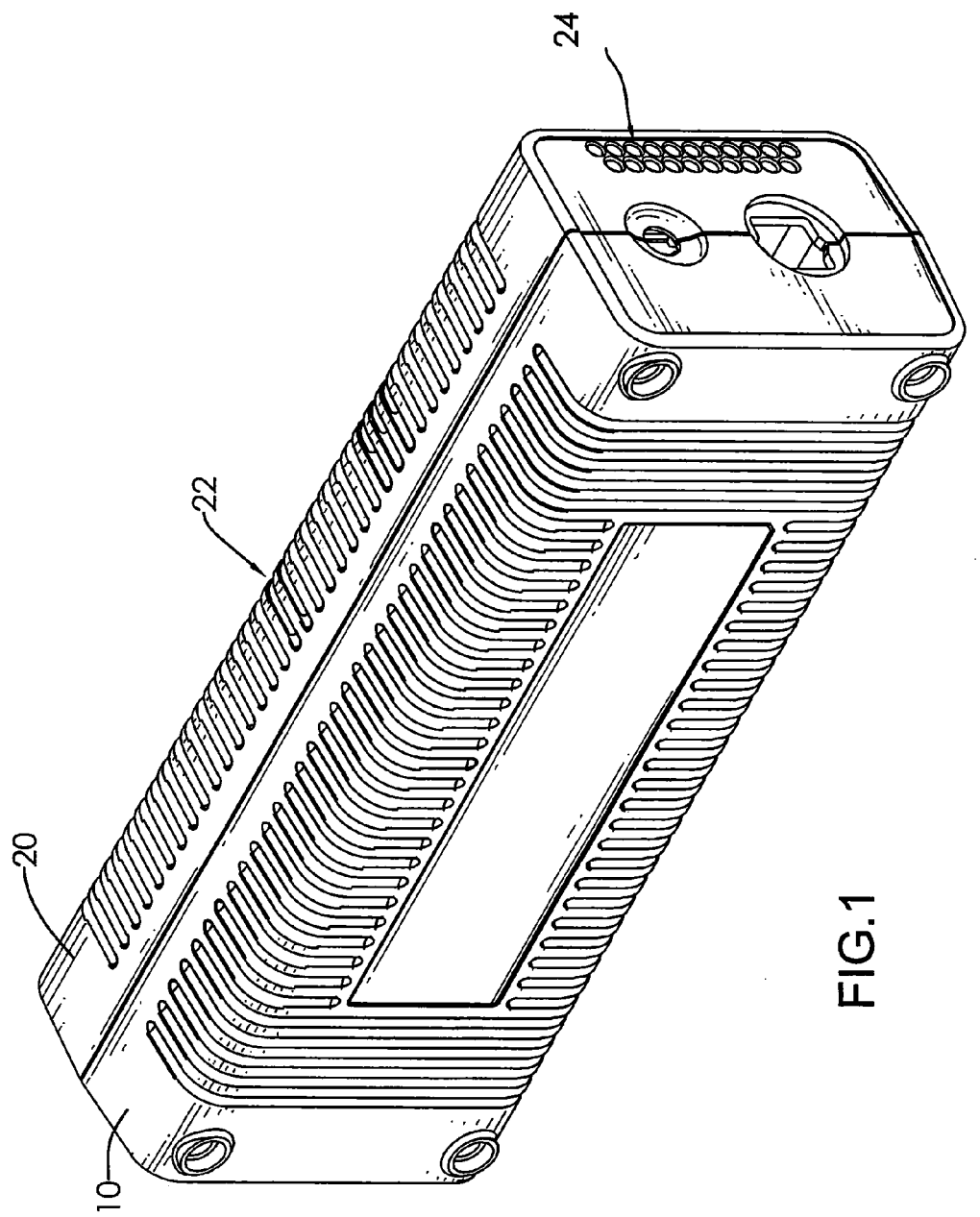
FIG. 1 is a perspective view of a waterproof casing for a power supply in accordance with the present invention.

With reference to FIG. 1, a waterproof casing for a power supply in accordance with the present invention comprises a lower casing (10), an upper casing (20), an inlet cover (30), an outlet cover (40) and a fan (50).

The lower casing (10) is elongated, contains electronic components and has an opening.

Figure 2:
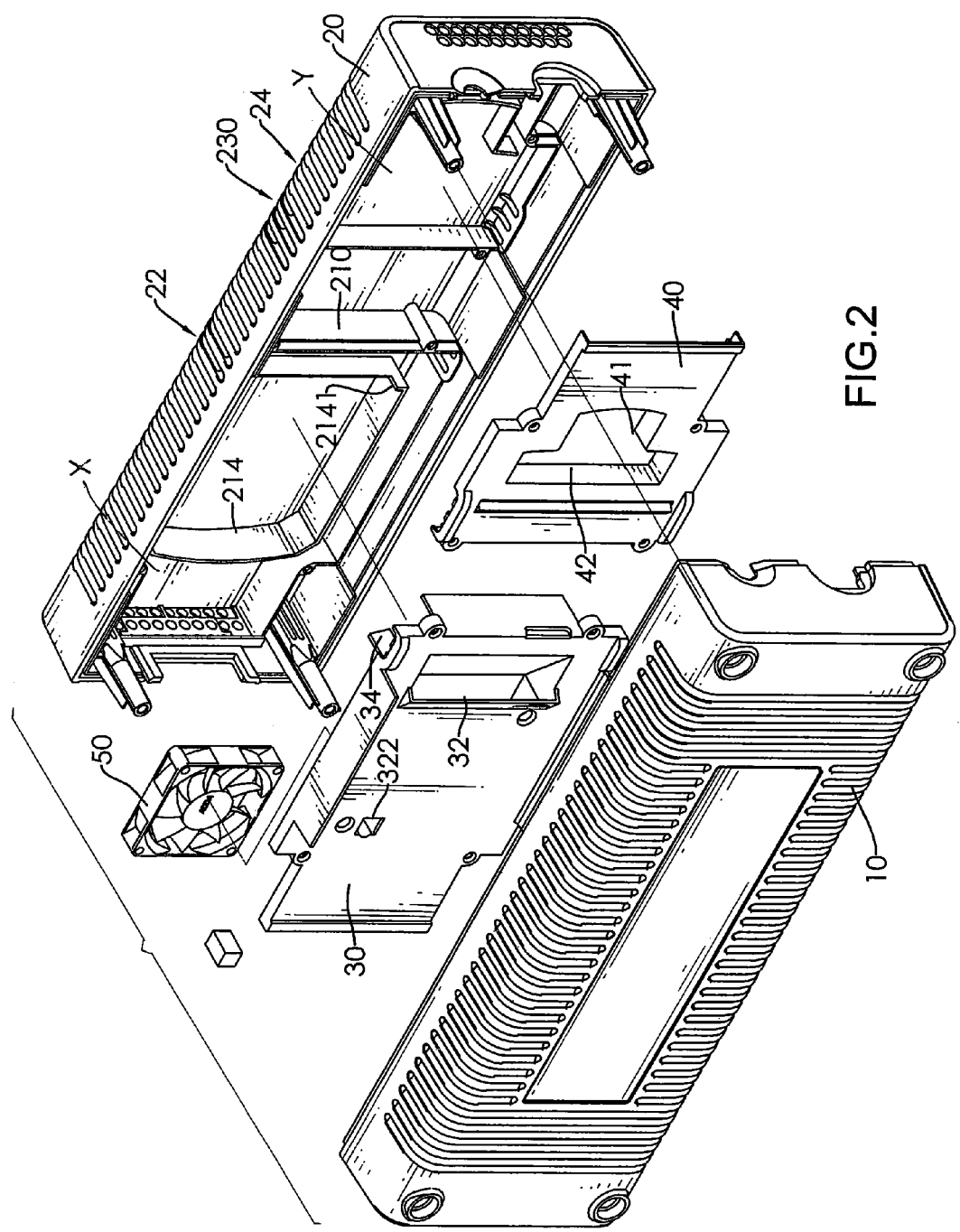
FIG. 2 is an exploded perspective view of the waterproof casing for a power supply in FIG. 1.
Figure 3:
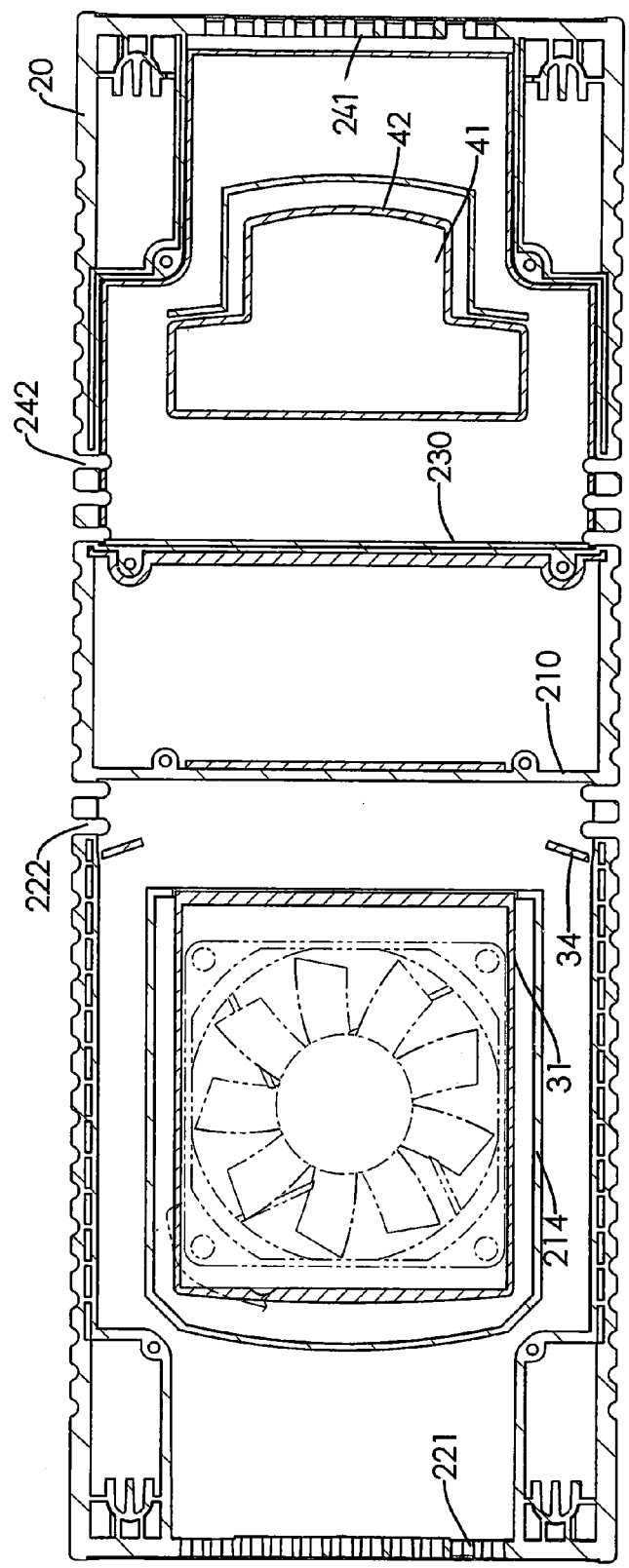
FIG. 3 is a cross-sectional top view of the waterproof casing for a power supply in FIG. 1.
Figure 4:
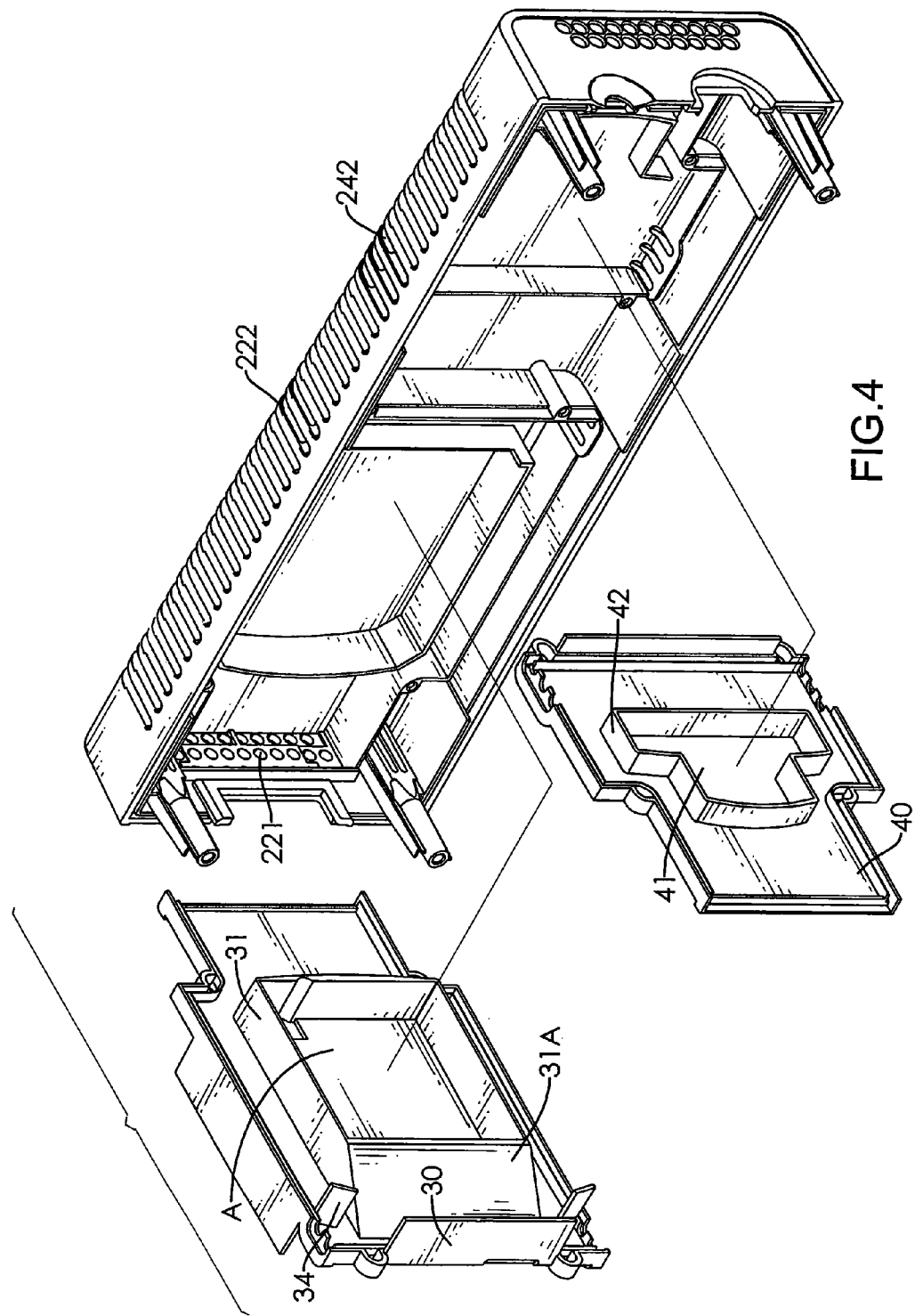
FIG. 4 is an enlarged exploded perspective view of the waterproof casing for a power supply in FIG. 1.
Figure 5:
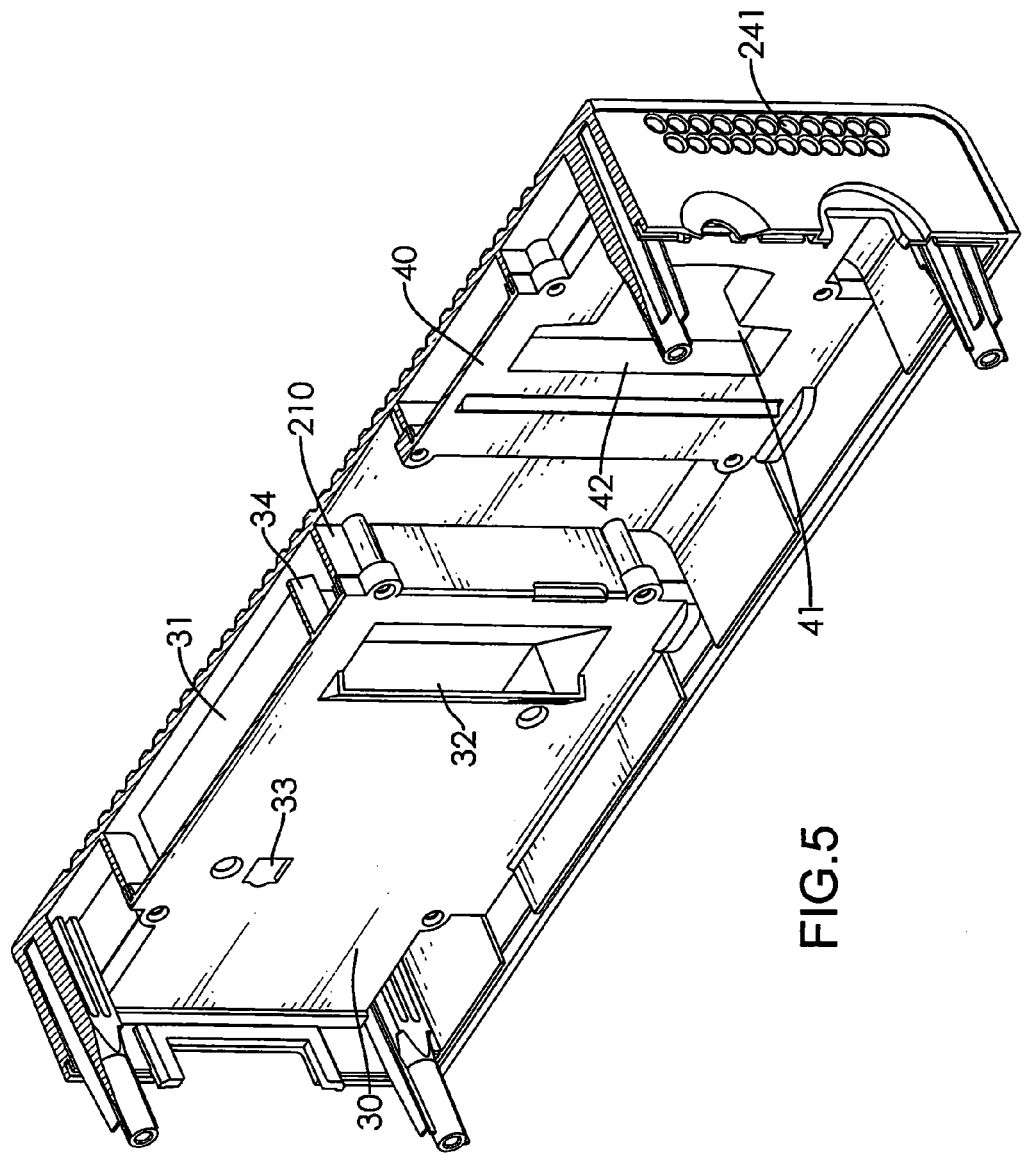
FIG. 5 is a cross-sectional perspective view of the waterproof casing for a power supply in FIG. 1.
Figure 6:
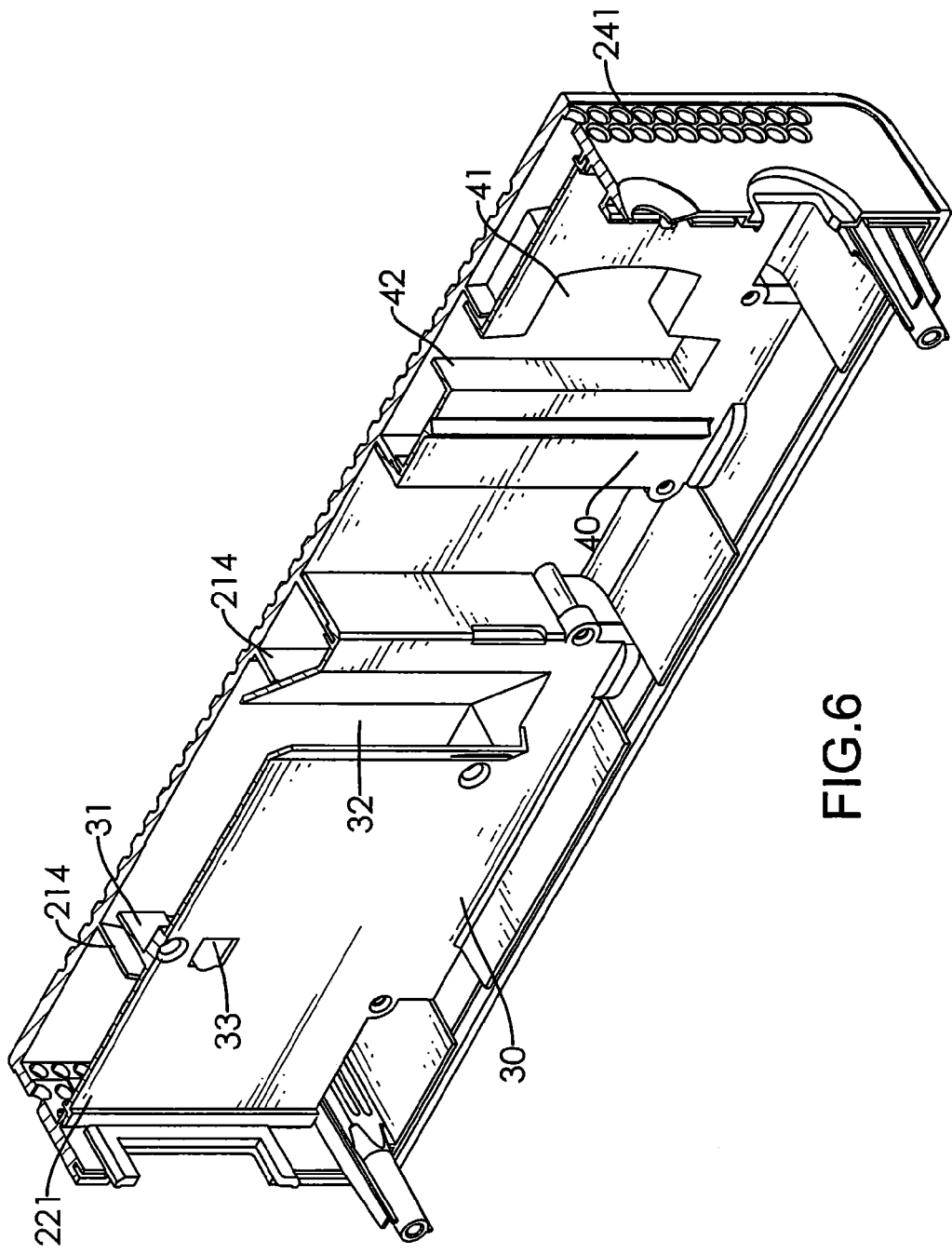
FIG. 6 is another cross-sectional perspective view of the waterproof casing for a power supply in FIG. 1.
Figure 7:
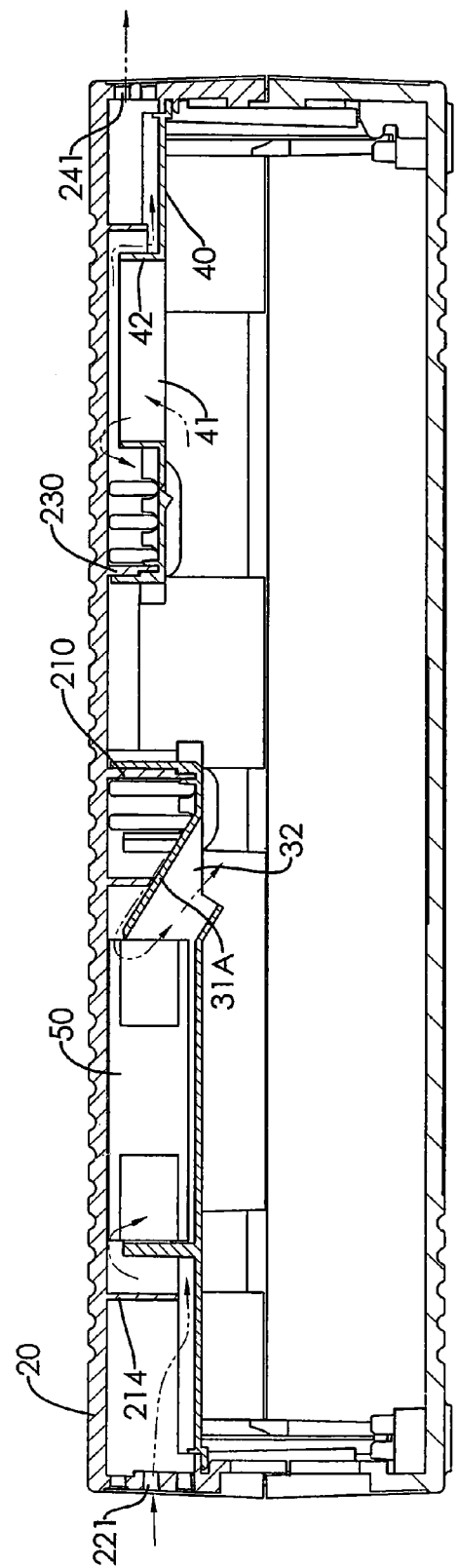
FIG. 7 is an operational cross-sectional side view of the waterproof casing for a power supply in FIG. 1.

With further reference to FIGS. 2 and 3, the upper casing (20) corresponds to and is detachably mounted on the opening of the lower casing (10) to form a full casing and has a top, two sidewalls, an inlet end wall, an outlet end wall, a first transverse wall (210), an inlet cavity (X), an enclosing wall (214), a second transverse wall (230), an outlet cavity (Y), at least one inlet (22) and at least one outlet (24).

The top has an inner surface.

The first transverse wall (210) is formed on the inner surface of the top between the sidewalls. The inlet cavity (X) is formed between the first transverse wall (210), the inlet end wall and the sidewalls of the upper casing (20) and has an opening.

The enclosing wall (214) is formed on and protrudes from the inner surface of the top, is formed inside the inlet cavity (X), surrounds a space and has a lower end and an elongated notch (2141). The elongated notch (2141) is formed in the lower end of the enclosing wall (214) near the first transverse wall (210) and has a top edge.

The second transverse wall (230) is formed on the inner surface of the top between the sidewalls adjacent to the first transverse wall (210). The outlet cavity (Y) is formed between the second transverse wall (230), the outlet end wall and the sidewalls of the upper casing (20) and has an opening.

The at least one inlet (22) is formed through the upper casing (20) and communicates with the inlet cavity (X) to allows the air to flow in the inlet cavity (X) and may be implemented with multiple round inlet holes (221) and four elongated inlet holes (222). The round inlet holes (221) are formed through the inlet end wall and communicates with the inlet cavity (X). Each two of the elongated inlet holes (222) are formed parallelly in pair, are formed through corresponding one of the sidewalls and communicate with the inlet cavity (X).

The at least one outlet (24) is formed through the upper casing (20) and communicates with the outlet cavity (Y) to allow the air to flow out of the upper casing (20) from the outlet cavity (Y) and may be implemented with multiple round outlet holes (241) and four outlet elongated holes (242). The round outlet holes (241) are formed through the outlet end wall and communicates with the outlet cavity (Y). Each two of the elongated outlet holes (242) are formed parallelly in pair, are formed through corresponding one of the sidewalls and communicate with the outlet cavity (Y).

With further reference to FIGS. 4 to 7, the inlet cover (30) detachably seals the opening of the inlet cavity (X) and has an upper surface, an isolating enclosing wall (31), an air hole (32), a wire hole (33) and two water guards (34).

The upper surface of the inlet cover (30) disconnects from the lower end of the enclosing wall (214).

The isolating enclosing wall (31) is formed on and protrudes from the upper surface of the inlet cover (30), protrudes into the space inside the enclosing wall (214) of the upper casing (20), surrounds a fan cavity (A), disconnects from the inner surface of the top of the upper casing (20) to allow the air to flow into the fan cavity (A) to keep water being outside the isolating enclosing wall (31) at the same time and may have an inclined portion (31A). The inclined portion (31A) of the isolating enclosing wall (31) is formed on the upper surface of the inlet cover (30) and corresponds to and is mounted through the elongated notch (2141) and disconnects from the top edge of the elongated notch (2141).

The air hole (32) is formed through the inlet cover (30), communicates with the fan cavity (A) to allow the air to flow out of the fan cavity (A) and may be formed under the inclined portion (31A) of the isolating enclosing wall (31).

The wire hole (33) is formed through the inlet cover (30) and communicates with the fan cavity (A).

The water guards (34) are formed on the upper surface of the inlet cover and each water guard (34) is mounted between the elongated inlet holes (222) in the corresponding sidewall of the upper casing (20) and the isolating enclosing wall (31) to guide the water flow.

The outlet cover (40) detachably seals the opening of the outlet cavity (Y) and has an air hole (41) and a surrounding enclosing wall (42).

The air hole (41) is formed through the outlet cover (40) and communicates with the outlet cavity (Y) and has an edge.

The surrounding enclosing wall (42) is formed along and protrudes upwardly from the edge of the air hole (41) of the outlet cover (40) and disconnects from the inner surface of the top of the upper casing (20) to keep the water from flowing through the air hole (41) so protects the electronic components in the lower casing (10).

The fan (50) is mounted in the fan cavity (A).

Consequently, the waterproof casing for a power supply as described not only draws the air into the power supply to help dissipating heat generated by the electronic components, but also prevents the electronic components from being damaged by the water. Most of all, structures of the waterproof casing is much simplified such that benefits manufacturing for a great quantity.

Even though numerous characteristics and advantages of the present invention have been set forth in the foregoing description, together with details of the structure and function of the invention, the disclosure is illustrative only. Changes may be made in detail, especially in matters of shape, size and arrangement of parts within the principles of the invention to the full extent indicated by the broad general meaning of the terms in which the appended claims are expressed.

What is claimed is:

1. A waterproof casing for a power supply comprising:
    a lower casing having an opening;
    an upper casing corresponding to and being detachably mounted on the opening of the lower casing and having
        a top having an inner surface;
        two sidewalls;
        an inlet end wall;
        an outlet end wall;
        a first transverse wall being formed on the inner surface of the top between the sidewalls;
        an inlet cavity being formed between the first transverse wall, the inlet end wall and the sidewalls of the upper casing and having an opening;
        a second transverse wall being formed on the inner surface of the top between the sidewalls adjacent to the first transverse wall;
        an outlet cavity formed between the second transverse wall, the outlet end wall and the sidewalls of the upper casing and having an opening;
        at least one inlet being formed through the upper casing and communicating with the inlet cavity; and
        at least one outlet being formed through the upper casing and communicating with the outlet cavity;
    an inlet cover detachably sealing the opening of the inlet cavity and having
        an upper surface;
        an isolating enclosing wall being formed on and protruding from the upper surface of the inlet cover, surrounding a fan cavity and disconnecting from the inner surface of the top of the upper casing; and
        an air hole being formed through the inlet cover and communicating with the fan cavity; and
    an outlet cover detachably sealing the opening of the outlet cavity and having
        an air hole being formed through the outlet cover and communicating with the outlet cavity and has an edge; and
        a surrounding enclosing wall being formed along and protruding upwardly from the edge of the air hole of the outlet cover and disconnecting from the inner surface of the top of the upper casing.

2. The waterproof casing for a power supply as claimed in claim 1, wherein the inlet cover further has and a wire hole being formed through the inlet cover and communicates with the fan cavity.

3. The waterproof casing for a power supply as claimed in claim 1, wherein
    the upper casing further has an enclosing wall being formed on and protruding from the inner surface of the top of the upper casing, being formed inside the inlet cavity, surrounding a space and having a lower end; and
    the upper surface of the inlet cover disconnects from the lower end of the enclosing wall.

4. The waterproof casing for a power supply as claimed in claim 2, wherein
    the upper casing further has an enclosing wall being formed on and protruding from the inner surface of the top of the upper casing, being formed inside the inlet cavity, surrounding a space and having a lower end; and
    the upper surface of the inlet cover disconnects from the lower end of the enclosing wall.

5. The waterproof casing for a power supply as claimed in claim 3, wherein
    the enclosing wall of the upper casing further has an elongated notch being formed in the lower end of the enclosing wall near the first transverse wall and having a top edge;
    the isolating enclosing wall of the inlet cover protrudes into the space inside the enclosing wall of the upper casing and has an inclined portion being formed on the upper surface of the inlet cover, corresponding to and being mounted through the elongated notch and disconnecting from the top edge of the elongated notch.

6. The waterproof casing for a power supply as claimed in claim 4, wherein
    the enclosing wall of the upper casing further has an elongated notch being formed in the lower end of the enclosing wall near the first transverse wall and having a top edge;
    the isolating enclosing wall of the inlet cover protrudes into the space inside the enclosing wall of the upper casing and has an inclined portion being formed on the upper surface of the inlet cover, corresponding to and being mounted through the elongated notch and disconnecting from the top edge of the elongated notch.

7. The waterproof casing for a power supply as claimed in claim 5, wherein
- each one of the at least one inlet of the upper casing is implemented with
  - multiple round inlet holes being formed through the inlet end wall of the upper casing and communicating with the inlet cavity of the upper casing; and
  - four elongated inlet holes, and each two of the elongated inlet holes being formed parallelly in pair, being formed through a corresponding sidewall of the upper casing and communicating with the inlet cavity of the upper casing;
- each one of the at least one outlet of the upper casing is implement with
  - multiple round outlet holes being formed through the outlet end wall of the upper casing and communicating with the outlet cavity of the upper casing; and
  - four outlet elongated holes, and each two of the elongated outlet holes being formed parallelly in pair, being formed through a corresponding sidewall of the upper casing and communicating with the outlet cavity of the upper casing; and
- the inlet cover further has two water guards being formed on the upper surface of the inlet cover, and each water guard being mounted between the elongated inlet holes in a corresponding sidewall of the upper casing and the isolating enclosing wall.

8. The waterproof casing for a power supply as claimed in claim 6, wherein
- each one of the at least one inlet of the upper casing is implemented with
  - multiple round inlet holes being formed through the inlet end wall of the upper casing and communicating with the inlet cavity of the upper casing; and
  - four elongated inlet holes, and each two of the elongated inlet holes being formed parallelly in pair, being formed through a corresponding sidewall of the upper casing and communicating with the inlet cavity of the upper casing;
- each one of the at least one outlet of the upper casing is implement with
  - multiple round outlet holes being formed through the outlet end wall of the upper casing and communicating with the outlet cavity of the upper casing; and
  - four outlet elongated holes, and each two of the elongated outlet holes being formed parallelly in pair, being formed through a corresponding sidewall of the upper casing and communicating with the outlet cavity of the upper casing; and
- the inlet cover further has two water guards being formed on the upper surface of the inlet cover, and each water guard being mounted between the elongated inlet holes in a corresponding sidewall of the upper casing and the isolating enclosing wall.

* * * * *